(12) United States Patent
Orcutt

(10) Patent No.: US 6,187,612 B1
(45) Date of Patent: Feb. 13, 2001

(54) MOLDED BALL GRID ARRAY PACKAGE MOLD DIE

(75) Inventor: John W. Orcutt, Richardson, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/250,642

(22) Filed: Feb. 16, 1999

Related U.S. Application Data

(60) Provisional application No. 60/074,975, filed on Feb. 17, 1998.

(51) Int. Cl.[7] .................................................. H01L 21/44
(52) U.S. Cl. .................................................. 438/106; 257/737
(58) Field of Search .................................. 438/124, 125, 438/126, 127, 123; 257/737, 738, 780

(56) References Cited

U.S. PATENT DOCUMENTS 5,293,072 * 3/1994 Tsuji et al. ............................. 257/737

* cited by examiner

Primary Examiner—David Nelms
Assistant Examiner—David Vu
(74) Attorney, Agent, or Firm—Wade James Brady, III; Frederick J. Telecky, Jr.

(57) ABSTRACT

A method of forming a ball grid array package wherein a mold comprising a first mold die (1) having a cavity therein for receiving a ball (5) and a second mold die (7) for mating with the first mold die are provided. A deformable material (3) is placed in the cavity, the deformable material being preferably non-adherent to the ball and the molding composition. The ball (5) is placed in the cavity over the deformable material and the mold is closed to cause the ball to deform the deformable material within the cavity. The molding composition (13) is then injected between the first and second mold dies. The second mold die can be provided with a depending finger (9) disposed opposed to the cavity to cause the ball to deform the deformable material in the cavity when the mold is closed. A lead frame (11) is provided between the ball and the first mold die with the ball being preferably attached to the lead frame. The deformable material is provided in a strip which moves and is indexed with the entry and removal of a lead frame strip portion into and from the mold. A layer of deformable material (17) can optionally be disposed between the second mold die and the ball.

20 Claims, 1 Drawing Sheet

MOLDED BALL GRID ARRAY PACKAGE MOLD DIE

This application claims priority under 35 USC 119(e)(1) of provisional application number 60/074,975 filed Feb. 17, 1998.

BACKGROUND OF THE INVENTION

1. Field of the Invention

This invention relates to a method of forming a ball grid array (BGA) package.

2. Brief Description of the Prior Art

Molded ball grid array (BGA) packages are fabricated in accordance with the prior art by attaching one or more balls to a lead frame and placing the lead frame with ball attached into a mold having a depression in the lower mold die for receiving the ball and a depending finger in the upper mold die for each ball to force the associated ball into and against the depression in the lower die. The mold material is then injected into the mold to encase the lead frame. A problem that arises is that the mold material tends to cover a major portion and possibly all of the ball, thereby requiring that additional work be performed on the molded package to remove mold material from the ball. This is generally accomplished by an additional abrading process step which is both costly and time consuming and can lead to diminished yield.

SUMMARY OF THE INVENTION

In accordance with the present invention, the above described problem inherent in the prior art is minimized if not eliminated.

Briefly, there is provided an arrangement the same as in the prior art with an additional deformable plastic layer is disposed against the lower mold die inner surface including the cavity for reception of the ball and, optionally, against the upper mold die inner surface. The plastic film will have the property of being non-adherable to the die or the mold compound. Such a plastic film can be fabricated, for example, from ethylene fluorinated copolymer or any high temperature film with from about 100 to about 450 percent elongation. The plastic film is generally on a roll and indexed to be fed to the die cavity in an appropriate length for each molding operation with the used plastic film then preferably being taken up on a second roll downstream at which time the plastic film is separated from the ball and molding compound. The result is that, when the mold is closed and the upper and lower mold dies come together, the depending finger will force the ball against the deformable plastic on the lower mold die. This causes the ball to be pushed into the film and cause the film to extrude, thereby filling up an additional portion of the cavity around the lower portion of the ball and possibly all of the cavity. Accordingly, when the mold compound is injected into the mold cavity, such mold compound is prevented from movement under the ball and merely fills the cavity to the sides of the ball. When the package is then removed from the die cavity, the plastic film is merely removed as noted above with the ball surface being free of flash.

BRIEF DESCRIPTION OF THE DRAWINGS

FIG. 2b is an exploded view of a portion of FIG. 2a; and

DESCRIPTION OF THE PREFERRED EMBODIMENT

Figure 1:
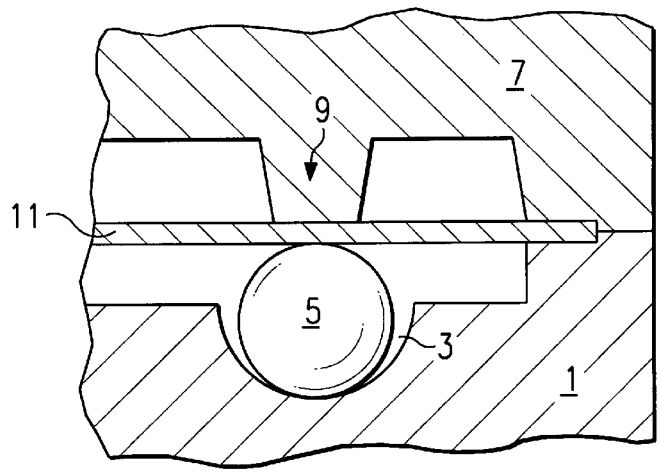
FIG. 1 is a schematic diagram of a prior art molding operation for a ball grid array.
Figure 2A:
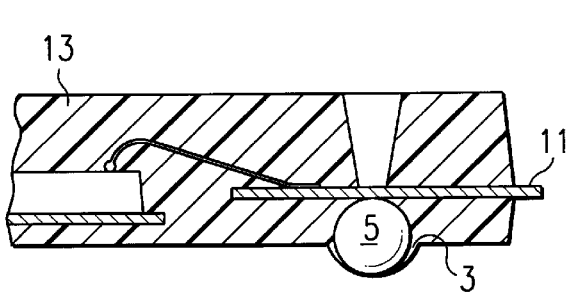
FIG. 2a is a cross-sectional view of a package as formed in accordance with the prior art molding operation of FIG. 1.
Figure 2B:
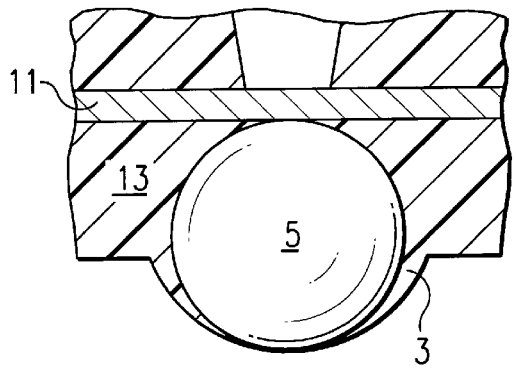

Referring first to FIG. 1, there is shown a prior art structure by which ball grid array packages are fabricated. There is provided a lower mold die 1 having a depression or cavity 3 therein for receiving a ball 5 of the ball grid array. An upper mold die 7 includes a depending finger 9, it being understood that the mold will have one cavity 3 and one depending finger 9 for each ball of the ball grid array. A lead frame 11 having one or more balls 5 attached thereto is disposed within the mold dies 1 and 7 with each ball extending into the associated cavity 3 and with each depending finger 9 disposed against the lead frame 11 and over an associated ball 5. A problem with this arrangement is that when molding material 13 is entered into the cavity between the upper and lower dies 1 and 7, some of the mold material tends to surround most if not all of the ball 5 as shown in FIGS. 2a and 2b. Accordingly, when the molded lead frame is removed from the dies, it is necessary to remove a sufficient amount of the mold material 13 from the surface of the ball 5 to enable later soldering of the package to a printed wiring board or the like. of the ball, thereby requiring that additional work be performed on the molded package to remove mold material from the ball. This is generally accomplished by an additional abrading process step which is both costly and time consuming and can lead to diminished yield.

Figure 3:
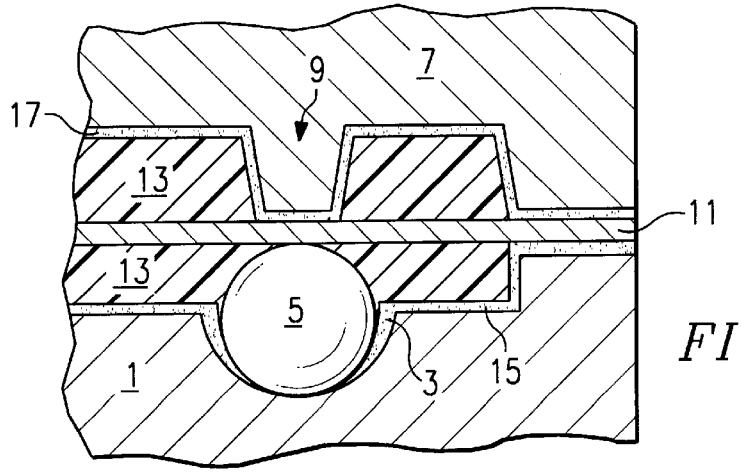
FIG. 3 is a schematic diagram of a molding operation for a ball grid array in accordance with the present invention.

Referring to FIG. 3, there is shown an arrangement the same as in FIG. 1 with all reference characters referring to the same or similar parts as in FIG. 1. In addition, a deformable plastic layer 15 is disposed against the lower mold die inner surface including the cavity for reception of the ball and, optionally, a further layer of deformable plastic material 17 is placed against the upper mold die inner surface. The result is that, when the mold is closed and the upper and lower mold dies come together, the depending finger will force the ball against the deformable plastic on the lower mold die. This causes the ball to be pushed into the film and causes the film to extrude, thereby filling up an additional portion of the cavity around the lower portion of the ball and possibly all of the cavity. Accordingly, when the mold compound is injected into the mold, such mold compound is prevented from movement under the ball and merely fills the cavity to the sides of the ball. When the package is then removed from the die cavity, the plastic film is merely removed with the ball surface being free of flash.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

What is claimed is:

1. A method of forming a ball grid array package which comprises the steps of:
   (a) providing a mold having a first mold die having a cavity therein for receiving a ball and a second mold die for mating with said first mold die;
   (b) placing a deformable material in said cavity;
   (c) placing a ball in said cavity over and in contact with said deformable material;

(d) closing said mold to cause said ball to move against and deform said deformable material in said cavity; and (e) then injecting a molding composition between said first and second mold dies.

2. The method of claim 1 further including the step of providing said second mold die with a depending finger disposed opposed to said cavity to cause said ball to deform said deformable material in said cavity.

3. The method of claim 1 further including the step of providing a lead frame between said ball and said first mold die.

4. A method of forming a ball grid array package which comprises the steps of:

(a) providing a mold having a first mold die having a cavity therein for receiving a ball and a second mold die for mating with said first mold die;

(b) placing a deformable material in said cavity;

(c) placing a ball in said cavity over said deformable material;

(d) closing said mold to cause said ball to deform said deformable material in said cavity (e) injecting a molding composition between said first and second mold dies;

(f) providing said second mold die with a depending finger disposed opposed to said cavity to cause said ball to deform said deformable material in said cavity; and (g) providing a lead frame between said ball and said depending finger.

5. A method of forming a ball grid array package which comprises the steps of:

(a) providing a mold having a first mold die having a cavity therein for receiving a ball and a second mold die for mating with said first mold die;

(b) placing a deformable material in said cavity;

(c) placing a ball in said cavity over said deformable material;

(d) closing said mold to cause said ball to deform said deformable material in said cavity;

(e) injecting a molding composition between said first and second mold dies; and (f) wherein said deformable material is provided in a strip which moves and is indexed with the entry and removal of a lead frame strip portion into and from between said first and second mold dies.

6. The method of claim 5 further including the step of providing said second mold die with a depending finger disposed opposed to said cavity to cause said ball to deform said deformable material in said cavity.

7. The method of claim 5 further including the step of providing a lead frame between said ball and said first mold die.

8. The method of claim 4 wherein said deformable material is provided in a strip which moves and is indexed with the entry and removal of a lead frame strip portion into and from between said first and second mold dies.

9. The method of claim 1 wherein said deformable material is essentially non-adherent to said ball and said molding composition.

10. The method of claim 2 wherein said deformable material is essentially non-adherent to said ball and said molding composition.

11. The method of claim 3 wherein said deformable material is essentially non-adherent to said ball and said molding composition.

12. The method of claim 4 wherein said deformable material is essentially non-adherent to said ball and said molding composition.

13. The method of claim 5 wherein said deformable material is essentially non-adherent to said ball and said molding composition.

14. The method of claim 6 wherein said deformable material is essentially non-adherent to said ball and said molding composition.

15. The method of claim 7 wherein said deformable material is essentially non-adherent to said ball and said molding composition.

16. The method of claim 8 wherein said deformable material is essentially non-adherent to said ball and said molding composition.

17. The method of claim 1 further including the step of disposing a layer of deformable material between said second mold die and said ball.

18. The method of claim 2 further including the step of disposing a layer of deformable material between said second mold die and said ball.

19. The method of claim 4 further including the step of disposing a layer of deformable material between said second mold die and said ball.

20. The method of claim 16 further including the step of disposing a layer of deformable material between said second mold die and said ball.

* * * * *